United States Patent
Park (10) Patent No.: US 9,947,404 B1
(45) Date of Patent: Apr. 17, 2018

(54) RESISTIVE MEMORY APPARATUS, SELECTIVE WRITE CIRCUIT THEREFOR, AND OPERATION METHOD THEREOF

(71) Applicant: SK hynix Inc., Icheon-si, Gyeonngi-do (KR)

(72) Inventor: Kee Teok Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/471,326

(22) Filed: Mar. 28, 2017

(30) Foreign Application Priority Data

Oct. 14, 2016 (KR) .................. 10-2016-0133319

(51) Int. Cl.
*G11C 13/00* (2006.01)

(52) U.S. Cl.
CPC ........ *G11C 13/0069* (2013.01); *G11C 13/004* (2013.01)

(58) Field of Classification Search
CPC .................................................. G11C 13/0069
USPC .......................................................... 365/148
See application file for complete search history.

(56) References Cited

U.S. PATENT DOCUMENTS

| | | | | |
|---|---|---|---|---|
| 2004/0022085 A1* | 2/2004 | Parkinson | ........... | G11C 11/5678 365/113 |
| 2006/0171236 A1* | 8/2006 | Atwood | ............... | G11C 7/1075 365/230.03 |
| 2012/0236624 A1* | 9/2012 | Costa | ...................... | G11C 11/56 365/148 |
| 2014/0016397 A1* | 1/2014 | Lee | ..................... | G11C 13/0069 365/148 |
| 2014/0140148 A1* | 5/2014 | An | ........................ | G11C 11/5642 365/189.14 |
| 2015/0380085 A1* | 12/2015 | Park | .................... | G11C 13/0069 365/148 |
| 2016/0012890 A1* | 1/2016 | Park | .................... | G11C 13/0069 365/148 |
| 2016/0042788 A1* | 2/2016 | Ahn | .................... | G11C 13/0061 365/148 |
| 2016/0196876 A1* | 7/2016 | Lee | .................... | G11C 13/0026 365/63 |

FOREIGN PATENT DOCUMENTS

KR 1020080081656 A 9/2008
KR 1020090053777 A 5/2009

* cited by examiner

*Primary Examiner* — Min Huang
(74) *Attorney, Agent, or Firm* — William Park & Associates Ltd.

(57) ABSTRACT

A resistive memory apparatus may include a memory cell array and a selective write circuit. The memory cell array may include a plurality of resistive memory cells coupled between a plurality of word lines and a plurality of bit lines. The selective write circuit may determine whether or not to perform a pre-read/comparison operation for a memory cell on which a next write operation is scheduled to be performed, based on a logic level of input data provided for a write operation. The selective write circuit may control the write operation for the memory cell array according to a determination result of the pre-read/comparison operation.

19 Claims, 6 Drawing Sheets

RESISTIVE MEMORY APPARATUS, SELECTIVE WRITE CIRCUIT THEREFOR, AND OPERATION METHOD THEREOF

CROSS-REFERENCES TO RELATED APPLICATION

The present application claims priority under 35 U.S.C. § 119(a) to Korean application number 10-2016-0133319 filed on Oct. 14, 2016, in the Korean Intellectual Property Office, which is incorporated herein by reference in its entirety.

BACKGROUND

1. Technical Field

Various embodiments may generally relate to a semiconductor apparatus, and more particularly to a resistive memory apparatus, a selective write circuit therefor, and an operation method thereof.

2. Related Art

A resistive memory apparatus may be a memory apparatus that stores data in a data storage material layer arranged between a pair of electrodes by changing a resistance state of the data storage material layer. The resistive memory apparatus exploits a resistance change of the data storage material layer induced by a voltage or an electric current.

Examples of the resistive memory apparatus may include a phase-change random access memory (PRAM). A unit memory cell of the PRAM may contain an access element and a data storage material layer made of a phase-change material. When a preset voltage is applied to a word line to write (program) data in the PRAM and a write pulse is applied to a bit line, a resistance state of the data storage material layer may be changed from a low-resistance state to a high-resistance state or vice versa. For example, a phase of the data storage material layer may change from a crystalline state to an amorphous state or vice versa.

An amount of the electrical current required for a write operation of the resistive memory apparatus may be an important factor in determining an operational performance and an efficiency of the resistive memory apparatus.

Therefore, it is important to minimize the amount of the electrical current required for the write operation.

SUMMARY

In an embodiment of the present disclosure, a resistive memory apparatus may include a memory cell array and a selective write circuit. The memory cell array may include a plurality of resistive memory cells coupled between a plurality of word lines and a plurality of bit lines. The selective write circuit may determine whether or not to perform a pre-read/comparison operation on a memory cell on which a next write operation is scheduled to be performed based on a logic level of input data provided for a write operation. The selective write circuit may control the write operation for the memory cell array according to a determination result of the pre-read/comparison operation.

In an embodiment of the present disclosure, a selective write circuit may include a pre-read control circuit, a read circuit, a comparison circuit, and a write circuit. The pre-read control circuit may generate a read enable signal based on a logic level of input data and a read command. The read circuit may read data stored in a memory cell on which a next write operation is scheduled to be performed and output read data in response to the read enable signal. The comparison circuit may generate a write control signal according to a result of comparing the read data with the input data. The write circuit may operate in response to the write control signal.

In an embodiment of the present disclosure, an operation method of a resistive memory apparatus including a memory circuit and a selective write circuit configured to write data in the memory circuit may include generating a read enable signal based on a level of input data and a read command through the selective write circuit. The method may include outputting read data by reading data stored in a memory cell on which the next write operation is scheduled to be performed when the read enable signal is enabled. The method may include generating a write control signal according to a result of comparing the read data with the input data. The method may include controlling a write operation in response to the write control signal.

These and other features, aspects, and embodiments are described below in the section entitled "DETAILED DESCRIPTION"

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
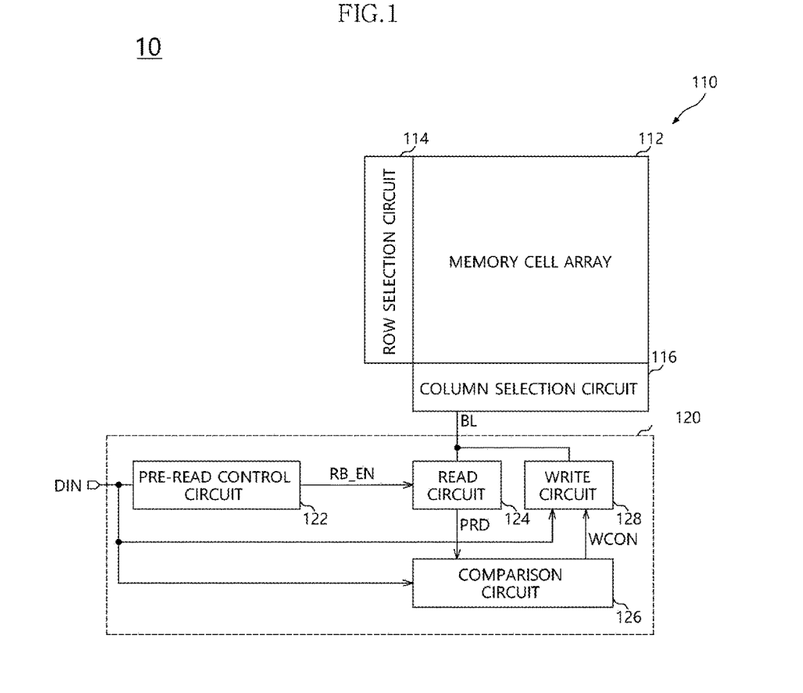
FIG. 1 is a diagram illustrating an example of a resistive memory apparatus according to an embodiment of the present disclosure.

FIG. 1 is a diagram illustrating an example of a resistive memory apparatus according to an embodiment.

Referring to FIG. 1, a resistive memory apparatus 10 according to an embodiment may include a memory circuit 110 and a selective write circuit 120.

The memory circuit 110 may include a memory cell array 112, a row selection circuit 114, and a column selection circuit 116.

The memory cell array 112 may include a plurality of memory cells coupled between a plurality of word lines and a plurality of bit lines. The memory cell may be a resistive memory cell, for example, a PRAM memory cell.

In an embodiment, the memory cell array 112 may consist of a plurality of mats, which is a unit of memory cell array. Each of the mats may include a plurality of resistive memory cells coupled between a plurality of word lines and a plurality of bit lines. The mat may consist of a plurality of blocks including a plurality of memory cells. In addition, the memory cell array may be divided into pages. The write operation of the resistive memory apparatus may be performed on a page basis and the write operation may be simultaneously performed on a plurality of pages.

Each memory cell constituting the memory cell array 112 may be a single level cell (SLC) which stores one bit of data per one memory cell or a multi-level cell (MLC) which stores two or more bits of data per one memory cell.

The row selection unit 114 and the column selection unit 116 may be address decoders. The row selection unit 114 may receive an address signal to decode it and obtain a row address of a memory cell to be accessed, for example, a word line address of the memory cell to be accessed. The column selection unit 116 may receive the address signal to decode it and obtain a column address of the memory cell to be accessed, for example, a bit line address of the memory cell to be accessed.

The selective write circuit 120 may perform a write operation based on a result of a pre-read/comparison operation, or may perform the write operation without performing the pre-read/comparison operation, according to a logic level of input data DIN provided for the write operation. For instance, the selective write circuit 120 may skip the pre-read/comparison operation if the input data DIN has a certain logic level.

The pre-read/comparison operation may be an operation that reads data stored in a memory cell on which the next write operation is scheduled to be performed and compares the previously stored data with the input data DIN. Here, the input data DIN may be data that is currently received to be written in the memory cell.

The selective write circuit 120 may perform the write operation on a memory cell based on the result of the pre-read/comparison operation. For example, the write operation may be performed on the memory cell only when the previously stored data differs from the input data DIN. In an embodiment, however, the pre-read/comparison operation may be performed only if the input data DIN has a logic value that consumes a relatively large amount of electric charges when it is written in the memory cell. If the input data DIN has a logic value that consumes a relatively small amount of electric charges when it is written in the memory cell, the selective write circuit 120 may skip the pre-read/comparison operation and perform the write operation without performing the pre-read/comparison operation.

In an embodiment, the selective write circuit 120 may include a pre-read control circuit 122, a read circuit 124, a comparison circuit 126, and a write circuit 128.

The pre-read control circuit 122 may determine whether or not to perform the pre-read operation based on the input data DIN provided for the write operation. For example, the pre-read control circuit 122 may determine the level of the input data DIN in response to the input data DIN provided for the write operation and output a read enable signal RB_EN in response to a read command.

In an embodiment, the pre-read control circuit 122 may enable the read enable signal RB_EN when the input data DIN has a first level, and may disable the read enable signal RB_EN when the input data DIN has a second level. For example, the read enable signal RB_EN may be enabled when "set" data is written and disabled when "reset" data is written.

To put it another way, the pre-read control circuit 122 may enable the read enable signal RB_EN when the level of the input data DIN is a logic level that a relatively large amount of electric charges is consumed when the logic level is written, and may disable the read enable signal RB_EN when the level of the input data DIN is a level that a relatively small amount of electric charges is consumed when the logic level is written.

The read circuit 124 may operate in response to the read enable signal RB_EN. When the read enable signal RB_EN is enabled, the read circuit 124 may output read data PRD based on cell data of a memory cell on which the next write operation will be performed. For example, the read circuit 124 may output read data PRD based on cell data represented by a voltage level of a bit line BL coupled to a memory cell on which the next write operation will be performed. The read circuit 124 may not operate when the read enable signal RB_EN is disabled.

The comparison circuit 126 may generate a write control signal WCON by comparing the logic levels of the read data PRD and the input data DIN.

In an embodiment, the comparison circuit 126 may disable the write control signal WCON when the logic level of the read data PRD is equal to that of the input data DIN, and may enable the write control signal WCON when the logic level of the read data PRD is different from that of the input data DIN.

The comparison circuit 126 may enable the write control signal WCON when the read enable signal RB_EN is disabled and the read data PRD is not provided from the read circuit 124.

The write circuit 128 may operate in response to the write control signal WCON. The write circuit 128 may generate a write pulse corresponding to the logic level of the input data DIN and apply the generated write pulse to the bit line BL when the write control signal WCON is enabled.

In the resistive memory apparatus such as the PRAM, an amount of power consumption in a "set" data write operation may be larger than an amount of power consumption in a "reset" data write operation. In an embodiment, before the "set" data is written in the resistive memory apparatus, the read enable signal RB_EN may be enabled to perform the pre-read operation. Here, the pre-read operation may be performed may be performed only when the logic level of the input data DIN is different from that of the read data PRD. When the "reset" data is written in the resistive memory apparatus, the read enable signal RB_EN may be disabled so that the write operation may be performed without the pre-read operation.

An amount of electric charges required in a read operation of the resistive memory apparatus may be larger than an amount of electric charges required in a write operation of certain data. By omitting the pre-read operation with respect to the certain data (e.g., "reset" data), therefore, the resistive memory apparatus may reduce power consumption.

Figure 2:
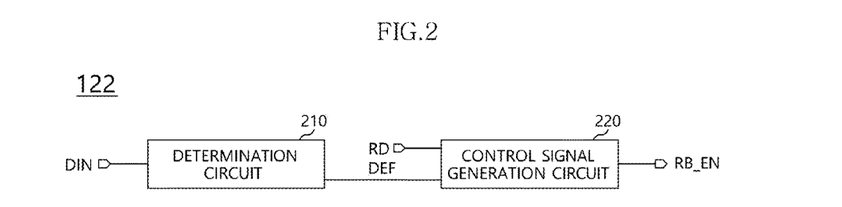
FIG. 2 is a diagram illustrating an example of a pre-read control circuit according to an embodiment of the present disclosure.

FIG. 2 is a diagram illustrating an example of a pre-read control circuit according to an embodiment.

Referring to FIG. 2, a pre-read control circuit 122 may include a determination circuit 210 and a control signal generation circuit 220.

The determination circuit 210 may generate a determination signal DEF by determining the logic level of the input data DIN. In an embodiment, the pre-read control circuit 122 may include at least one inverter, but the present disclosure is not limited thereto.

The control signal generation circuit 220 may output the read enable signal RB_EN in response to the determination signal DEF and a read command RD.

In an embodiment, when the read command RD is enabled, the control signal generation circuit 220 may disable the read enable signal RB_EN if the determination signal DEF is at a preset level. The control signal generation circuit 220 may disable the read enable signal RB_EN regardless of the level of the determination signal DEF when the read command RD is disabled.

In an embodiment, the control signal generation circuit 220 may include an AND operation circuit (e.g., AND gate) or an NAND operation circuit (e.g., NAND gate), but the present disclosure is not limited thereto.

In performing the pre-read operation, the read enable signal RB_EN may be disabled when the logic level of the input data DIN is a certain level (e.g., a logic level represented by a high resistance state).

For example, an amount of electric charges used to perform the "set" data read operation may be 10 pC, and an amount of electric charges used to perform the "set" data write operation may be 40 pC. In addition, an amount of electric charges used to perform the "reset" data read operation may be 8 pC, and an amount of electric charges used to perform the "reset" data write operation may be 6 pC.

When the pre-read operation is performed whenever the write operation is performed regardless of the logic level of data to be written, the total amount of electric charge that is used in performing both the pre-read operation and the write operation is shown in the following Table 1.

TABLE 1

| Pre-read data (PRD) | Data to be written (DIN) | Amount of electric charge (pC) | | |
|---|---|---|---|---|
| | | Pre-read | Write | Total |
| Reset | Reset | 8 | 0 | 8 |
| Set | Reset | 10 | 6 | 16 |
| Reset | Set | 8 | 40 | 48 |
| Set | Set | 10 | 0 | 10 |

When the pre-read operation is omitted in a case where data to be written has a certain level (e.g., a logic level represented by a high resistance state), the total amount of electric charge that is used in performing both the pre-read operation and the write operation is shown in the following Table 2.

TABLE 2

| Pre-read data (PRD) | Data to be written (DIN) | Amount of electric charge (pC) | | |
|---|---|---|---|---|
| | | Pre-read | Write | Total |
| Reset | Reset | 0 | 6 | 6 |
| Set | Reset | 0 | 6 | 6 |
| Reset | Set | 8 | 40 | 48 |
| Set | Set | 10 | 0 | 10 |

It can be seen from the tables that the total power consumption may be reduced by omitting the pre-read operation when the reset data is written.

The savings of electrical power that would otherwise be needed for some pre-read operations (e.g., pre-read operation to be performed when the input data DIN is the "reset" data) may increase an operational efficiency of the PRAM.

In addition, a resistance drift that would otherwise occur due to the repetition of the pre-read operation may also be suppressed, and thus the reliability and lifespan of the PRAM may be improved.

Figure 3:
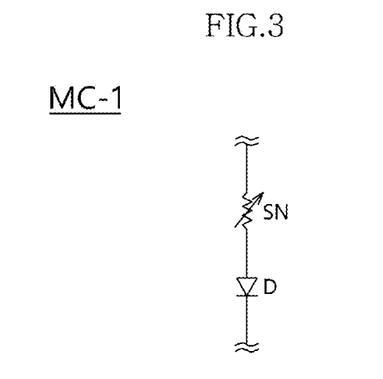
FIGS. 3 to 5 are diagrams illustrating example configurations of memory cells according to embodiments of the present disclosure.
Figure 4:
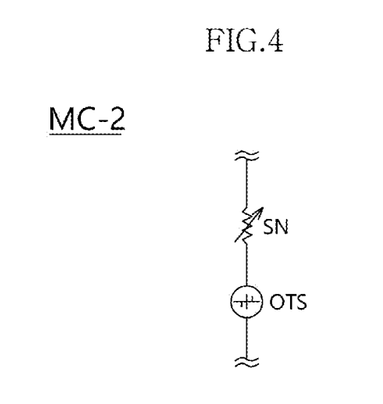
Figure 5:
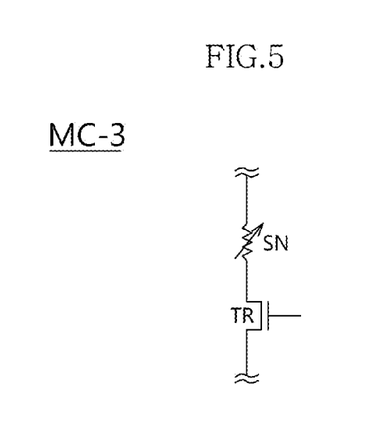

FIGS. 3 to 5 are diagrams illustrating example configurations of memory cells according to embodiments.

FIG. 3 illustrates an example of a memory cell MC-1 including a storage node SN and an access element D coupled in series. Here, the access element D may be a diode.

The storage node SN may contain a material that changes in a resistance value according to an applied electric current. The access element D may be a vertical channel transistor. Alternatively, the access element D may be a horizontal channel transistor.

FIG. 4 illustrates an example of a memory cell MC-2 in which a storage node SN and an access element OTS are coupled in series. Here, the access element OTS may be an ovonic threshold switching device.

FIG. 5 illustrates an example of a memory cell MC-3 in which a storage node SN and an access element TR are coupled in series. Here, the access element TR may be a transistor. In an embodiment, the access element TR may be a MOS transistor. For example, the access element TR may be a vertical channel MOS transistor.

Figure 6:
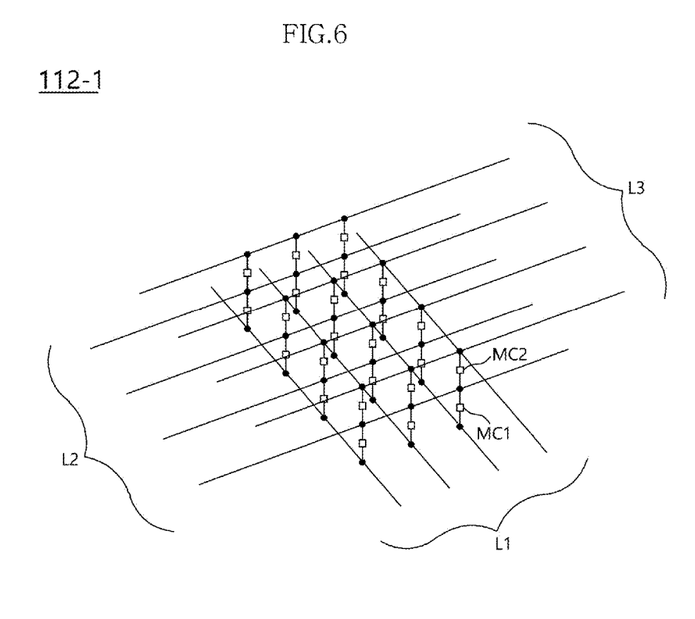
FIG. 6 is a diagram illustrating an example configuration of a memory cell array according to an embodiment of the present disclosure.

FIG. 6 is a diagram illustrating an example configuration of a memory cell array according to an embodiment.

A memory cell array 112-1 illustrated in FIG. 6 may have a cross point array structure.

For example, a first memory cell MC1 may be arranged between a first wiring L1 and a second wiring L2, and a second memory cell MC2 may be arranged between the second wiring L2 and a third wiring L3.

The second wiring L2 may be arranged over the first wiring L1 which is disposed over a substrate (not illustrated). The third wiring L3 may be arranged over the second wiring L2.

The first memory cell MC1 and the second memory cell MC2 may be symmetrical about the second wiring L2, but the present disclosure is not limited thereto.

FIGS. 7 to 11 are diagrams illustrating examples of an electronic apparatus according to various embodiments of the present disclosure.

Figure 7:
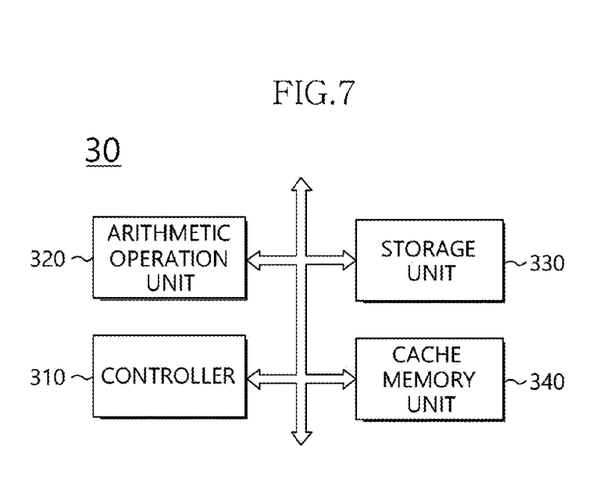
FIGS. 7 to 11 are diagrams illustrating examples of electronic apparatuses according to embodiments of the present disclosure.

FIG. 7 is a diagram illustrating an example of a processor as an electronic apparatus according to an embodiment of the present disclosure.

Referring to FIG. 7, a processor 30 may include a controller 310, an arithmetic operation unit 320, a storage unit 330, and a cache memory unit 340.

The controller 310 may control an overall operation of the processor 30 such as command decoding, data input/output, and data processing in response to command and data signals provided from an external apparatus.

The arithmetic operation unit 320 may perform several arithmetic operations according to a command decoded by the controller 310. The arithmetic operation unit 320 may include at least one arithmetic and logic unit (ALU), but the present disclosure is not limited thereto.

The storage unit 330 may serve as a register, and may store data in the processor 30. The storage unit 330 may include a data register, an address register, a floating-point register, and other various registers. The storage unit 330 may store addresses in which data being processed or to be processed in the arithmetic operation unit 320 are stored.

The storage unit 330 may include a resistive memory apparatus, and, for example, the storage unit 330 may include the selective write circuit illustrated in FIG. 1. Accordingly, when performing a write operation that uses a relatively large amount of electric charges, the storage unit 330 may perform the write operation after performing the pre-read operation, and when performing a write operation that uses a relatively small amount of electric charges, the storage unit 330 may perform the write operation without performing the pre-read operation.

The cache memory unit 340 may serve as a temporary storage space.

The processor 30 illustrated in FIG. 7 may be a central processing unit (CPU) of an electronic apparatus, a graphic processing unit (GPU), a digital signal processor (DSP), an application processor (AP), and the like.

Figure 8:
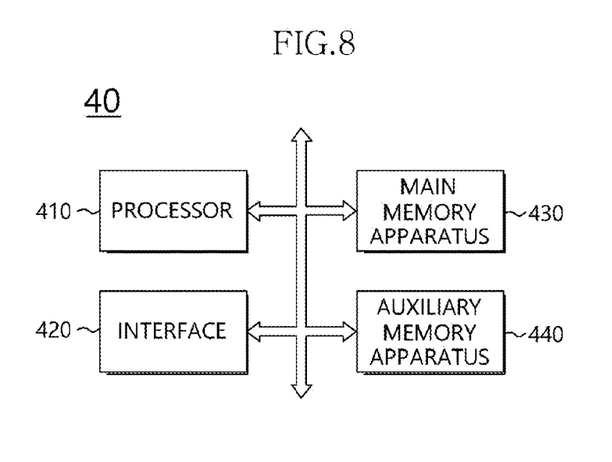
Figure 9:
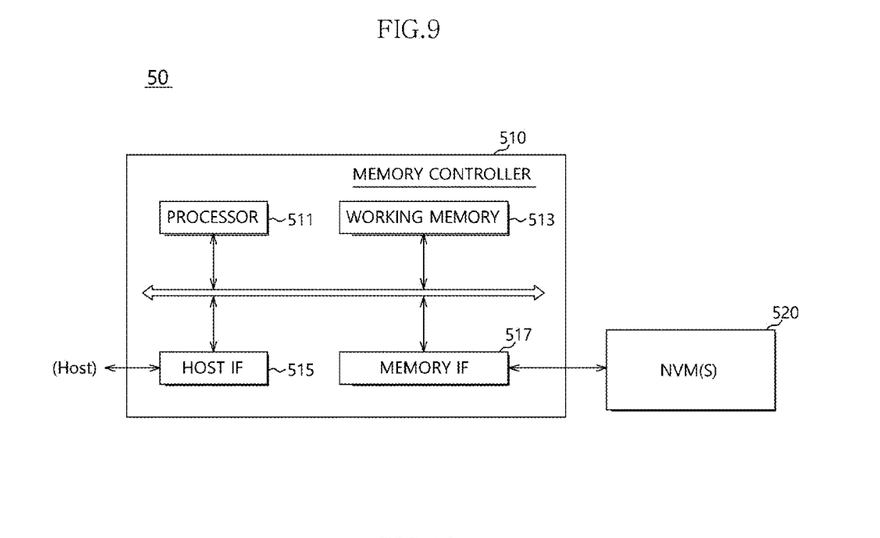

FIGS. 8 and 9 are diagrams illustrating examples of a data processing system as an electronic apparatus according to various embodiments of the present technical spirit.

A data processing system 40 illustrated in FIG. 8 may include a processor 410, an interface 420, a main memory apparatus 430, and an auxiliary memory apparatus 440.

The data processing system 40 may perform input, processing, output, communication, storage, and the like to perform a series of operations for data processing, and may be an electronic apparatus such as a computer server, a personal portable terminal, a portable computer, a web tablet computer, a wireless terminal, a mobile communication terminal, a digital content player, a camera, a satellite navigation system, a video camera, a tape recorder, a telematics device, an audio/video (AV) system, or a smart television (TV).

In an embodiment, the data processing system 40 may be a data storage apparatus. The data processing system 40 may be a disc type apparatus such as a hard disc, an optical drive, a solid state disc, or a digital versatile disc (DVD) or a card type apparatus such as a universal serial bus (USB) memory, a secure digital (SD) card, a memory stick, a smart media card, internal/external multimedia cards, or a compact flash card.

The processor 410 may exchange data between the data processing system 40 and an external apparatus through the interface 420, and the processor 410 may perform an overall operation such as decoding of commands input from the external apparatus through the interface 420 and an operation or comparison of data stored in the system.

The interface 420 may provide an environment that a command and data are exchangeable between the external apparatus and the data processing system 40. The interface 420 may be a man-machine interface apparatus which includes an input apparatus (e.g., a keyboard, a keypad, a mouse, a voice recognition apparatus, and the like) and an output apparatus (e.g., a display, speaker, and the like) or a card interface apparatus or a disc interface apparatus (e.g., Integrated Drive Electronics (IDE), Small Computer System Interface [SCSI], Serial Advanced Technology Attachment [SATA], External SATA [eSATA], Personal Computer Memory Card International Association [PCMCIA], and the like) according to an application environment of the data processing system 40.

The main memory apparatus 430 may store an application, a control signal, data, and the like required for an operation of the data processing system 40, and may serve as a storage space that may transfer program or data from the auxiliary storage apparatus 440 to execute the program. The main memory apparatus 430 may be implemented using a resistive memory apparatus.

The auxiliary memory apparatus 440 may be a space for storing a program code, data, and the like, and may be a high-capacity memory apparatus. For example, the auxiliary memory apparatus 440 may be implemented using a resistive memory apparatus.

The main memory apparatus 430 and the auxiliary memory apparatus 440 may include the selective write circuit illustrated in FIG. 1. Accordingly, when performing a write operation that uses a relatively large amount of electric charges, the main memory apparatus 430 and the auxiliary memory apparatus 440 may perform the write operation after performing the pre-read operation, and when performing a write operation that uses a relatively small amount of electric charges, the main memory apparatus 430 and the auxiliary memory apparatus 440 may perform the write operation without performing the pre-read operation.

A data processing system 50 illustrated in FIG. 9 may include a memory controller 510 and a nonvolatile memory apparatus 520 including a resistive memory apparatus.

The memory controller 510 may access the nonvolatile memory apparatus 520 in response to a request from a host. The memory controller 510 may include a processor 511, a working memory 513, a host interface 515, and a memory interface 517.

The process 511 may control an overall operation of the memory controller 510. The working memory 513 may store an application, data, a control signal, and the like required for the operation of the memory controller 510.

The host interface 515 may perform protocol conversion for exchange of data and a control signal between the host and the memory controller 510, and the memory interface 517 may perform protocol conversion for exchange of data and a control signal between the memory controller 510 and the nonvolatile memory apparatus 520.

In an embodiment, the nonvolatile memory apparatus 520 and/or the working memory 513 may include the selective write circuit illustrated in FIG. 1. Accordingly, when performing a write operation that uses a relatively large amount of electric charges, the nonvolatile memory apparatus 520 may perform the write operation after performing the pre-read operation, and when performing a write operation that uses a relatively small amount of electric charges, the nonvolatile memory apparatus 520 may perform the write operation without performing the pre-read operation. The data processing system 50 illustrated in FIG. 9 may be used in a disc apparatus or an internal/external memory card of a portable electronic apparatus. The data processing system 50 may be used as an image processor and other application chipsets.

Figure 10:
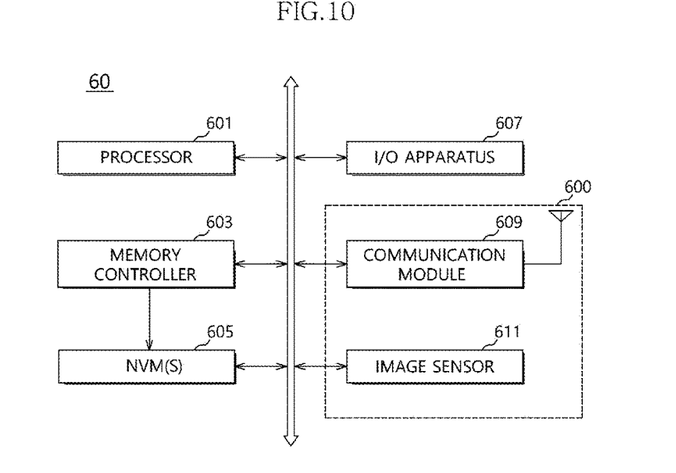
Figure 11:
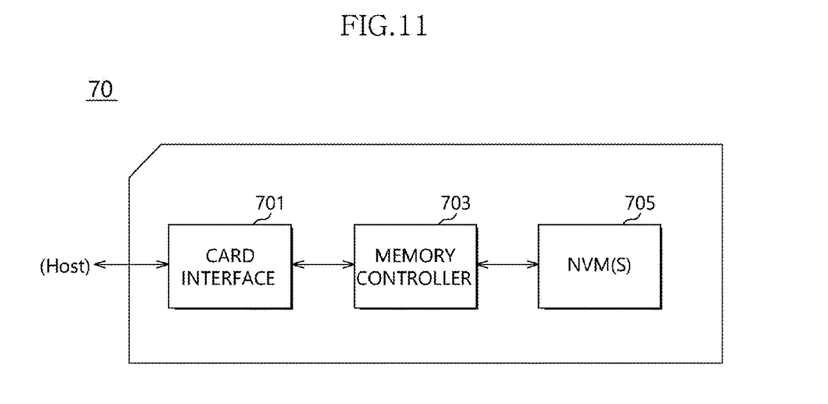

FIGS. 10 and 11 are diagrams illustrating examples of an electronic apparatus according to various embodiments of the present disclosure.

An electronic apparatus 60 illustrated in FIG. 10 may include a processor 601, a memory controller 603, a nonvolatile memory apparatus 605, an input/output (I/O) apparatus 607, and a function module 600.

The memory controller 603 may control a data processing operation such as a write operation and a read operation of the nonvolatile memory apparatus 605 in response to control signals provided by the processor 601.

Data programmed in the nonvolatile memory apparatus 605 may be output through the I/O apparatus 607 in response to control signals provided by the processor 601 and the memory controller 603. For example, the I/O apparatus 607 may include a display apparatus, a speaker apparatus, and the like.

In an embodiment, the nonvolatile memory apparatus 605 may include a resistive memory apparatus illustrated in FIG. 1, and the resistive memory apparatus may include a selective write circuit as illustrated in FIG. 1. Accordingly, when performing a write operation that uses a relatively large amount of electric charges, the nonvolatile memory apparatus 605 may perform the write operation after performing the pre-read operation, and when performing a write operation that uses a relatively small amount of electric charges, the nonvolatile memory apparatus 605 may perform the write operation without performing the pre-read operation.

The I/O apparatus 607 may also include an input apparatus, and the I/O apparatus 607 may input, through the input apparatus, a control signal for controlling an operation of the processor 601 or data to be processed in the processor 601.

In an embodiment, the memory controller 603 may be implemented as a portion of the processor 601 or a separate chipset from the processor 601.

The function module 600 may be a module that may perform a function selected according to an application example of the electronic apparatus 60 illustrated in FIG. 10, and a communication module 609 and an image sensor 611 as an example of the function module 600 are illustrated in FIG. 10.

The communication module 609 may provide a communication environment that the electronic apparatus 60 is coupled to a wired or wireless communication network to exchange data and a control signal.

The image sensor 611 may convert an optical image to digital image signals and transfer the digital image signals to the processor 601 and the memory controller 603.

When the function module 600 includes the communication module 609, the electronic apparatus 60 of FIG. 10 may be a portable communication apparatus such as a wireless communication terminal. When the function module 600 includes the image sensor 611, the electronic apparatus 60 may be a digital camera, a digital camcorder, or an electronic system (e.g., a personal computer [PC], a laptop computer, a mobile communication terminal, and the like) to which any one of the digital camera and the digital camcorder is attached.

The electronic apparatus 60 may also include both the communication module 609 and the image sensor 611.

An electronic apparatus 70 illustrated in FIG. 11 may include a card interface 701, a memory controller 703, and a nonvolatile memory apparatus 705.

FIG. 11 is a diagram illustrating an example of the electronic apparatus 70 used as a memory card or a smart card, and the electronic apparatus 70 illustrated in FIG. 11 may be one of a PC card, a multimedia card, an embedded multimedia card, a secure digital card, and a universal serial bus (USB) drive.

The card interface 701 may perform interacting on data exchange between a host and the memory controller 703 according to a protocol of the host. In an embodiment, the card interface 701 may be hardware that may support a protocol used in the host. Alternatively, the card interface 701 may be software installed in the hardware supporting the protocol used in the host, or may be a signal transmission method.

The memory controller 703 may control data exchange between the nonvolatile memory apparatus 705 and the card interface 701.

The nonvolatile memory apparatus 705 may employs a resistive memory apparatus 10 illustrated in FIG. 1, and for example, the resistive memory apparatus may include the selective write circuit illustrated in FIG. 1. Accordingly, when performing a write operation that uses a relatively large amount of electric charges, the nonvolatile memory apparatus 705 may perform the write operation after performing the pre-read operation, and when performing a write operation that uses a relatively small amount of electric charges, the nonvolatile memory apparatus 705 may perform the write operation without performing the pre-read operation.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A resistive memory apparatus comprising:
   a memory cell array including a plurality of resistive memory cells coupled between a plurality of word lines and a plurality of bit lines; and
   a selective write circuit configured to determine whether or not to perform a pre-read/comparison operation on a memory cell on which a next write operation is scheduled to be performed, based on a logic level of input data provided for a write operation, the selective write circuit controlling the write operation for the memory cell array according to a determination result of the pre-read/comparison operation,
   wherein the pre-read/comparison operation includes an operation that reads data stored in the memory cell on which the next write operation is scheduled to be performed and compares the previously stored data with the input data.

2. The resistive memory apparatus of claim 1, wherein the selective write circuit performs the write operation based on a result of the pre-read/comparison operation when the logic level of the input data is a logic level that requires the resistive memory apparatus to use a relatively large amount of electric charges in writing the input data, and performs the write operation without performing the pre-read/comparison operation when the logic level of the input data is a logic level that requires the resistive memory apparatus to use a relatively small amount of electric charges in writing the input data.

3. The resistive memory apparatus of claim 1, wherein the selective write circuit performs the write operation based on a result of the pre-read/comparison operation when the input data is data that is represented by a low-resistance state of the memory cell, and performs the write operation without performing the pre-read/comparison operation when the input data is data that is represented by a high-resistance state of the memory cell.

4. The resistive memory apparatus of claim 1, wherein the selective write circuit skips the write operation when a logic value of previously stored data in the memory cell is equal to a logic level of the input data as a result of the pre-read/comparison operation.

5. The resistive memory apparatus of claim 1, wherein the selective write circuit performs the write operation when a logic value of previously stored data in the memory cell is different from a logic level of the input data as a result of the pre-read/comparison operation result.

6. A selective write circuit comprising:
a pre-read control circuit configured to generate a read enable signal based on a logic level of input data and a read command;
a read circuit configured to read data stored in a memory cell on which a next write operation is scheduled to be performed and output read data in response to the read enable signal;
a comparison circuit configured to generate a write control signal according to a result of comparing the read data with the input data; and
a write circuit configured to operate in response to the write control signal.

7. The selective write circuit of claim 6, wherein the pre-read control circuit includes:
a determination circuit configured to generate a determination signal by determining the logic level of the input data; and
a control signal generation circuit configured to disable the read enable signal when the read command is enabled and the determination signal is at a preset level, and disable the read enable signal when the read command is disabled.

8. The selective write circuit of claim 6, wherein the pre-read control circuit includes:
a determination circuit configured to generate a determination signal by determining the logic level of the input data; and
a control signal generation circuit configured to enable the read enable signal when the determination signal is not at a preset level in a state where the read command is enabled.

9. The selective write circuit of claim 6, wherein the comparison circuit enables the write control signal when the read command is enabled and the read enable signal is disabled.

10. The selective write circuit of claim 6, wherein the write circuit generates a write pulse corresponding to the logic level of the input data when the write control signal is enabled.

11. The selective write circuit of claim 6, wherein the write circuit does not operate when the write control signal is disabled.

12. The selective write circuit of claim 6, wherein the pre-read control circuit enables the read enable signal when the input data is at a first level.

13. The selective write circuit of claim 12, wherein the first level is a logic level represented by a low-resistance state.

14. The selective write circuit of claim 6, wherein the pre-read control circuit disables the read enable signal when the input data is at a second level.

15. The selective write circuit of claim 14, wherein the second level is a logic level represented by a high resistance state.

16. An operation method of a resistive memory apparatus including a memory circuit and a selective write circuit configured to write data in the memory circuit, the method comprising:
generating a read enable signal based on a logic level of input data and a read command;
outputting read data by reading data stored in a memory cell on which the next write operation is scheduled to be performed when the read enable signal is enabled;
generating a write control signal according to a result of comparing the read data with the input data; and
controlling a write operation in response to the write control signal.

17. The method of 16, further comprising generating a determination signal by determining the logic level of the input data,
wherein generating the read enable signal further includes:
disabling the read enable signal when the read command is enabled and the determination signal is at a preset level and when the read command is disabled; and
enabling the read enable signal when the determination signal is not at the preset level in a state where the read command is enabled.

18. The method of claim 16, wherein generating the write control signal further includes enabling the write control signal when the read command is enabled and the read enable signal is disabled.

19. The method of claim 16, wherein the write circuit generates a write pulse corresponding to the logic level of the input data when the write control signal is enabled.

* * * * *